(12) United States Patent
Nishizawa et al.

(10) Patent No.: US 12,033,905 B2
(45) Date of Patent: Jul. 9, 2024

(54) SEMICONDUCTOR DEVICE AND METHOD FOR MANUFACTURING THE SAME

(71) Applicant: Mitsubishi Electric Corporation, Tokyo (JP)

(72) Inventors: Koichiro Nishizawa, Tokyo (JP); Takayuki Hisaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 381 days.

(21) Appl. No.: 17/276,348

(22) PCT Filed: Mar. 6, 2019

(86) PCT No.: PCT/JP2019/008876
§ 371 (c)(1),
(2) Date: Mar. 15, 2021

(87) PCT Pub. No.: WO2020/179020
PCT Pub. Date: Sep. 10, 2020

(65) Prior Publication Data
US 2022/0044978 A1 Feb. 10, 2022

(51) Int. Cl.
*H01L 23/06* (2006.01)
*H01L 23/04* (2006.01)
*H01L 23/538* (2006.01)

(52) U.S. Cl.
CPC .............. *H01L 23/06* (2013.01); *H01L 23/04* (2013.01); *H01L 23/5383* (2013.01)

(58) Field of Classification Search
CPC ..... H01L 23/06; H01L 23/04; H01L 23/5383; H01L 23/10; H01L 23/045; H01L 23/043;
(Continued)

(56) References Cited

U.S. PATENT DOCUMENTS 5,023,624 A * 6/1991 Heckaman ......... H01Q 21/0087
333/33
2005/0116352 A1 6/2005 Warashina et al.
(Continued)

FOREIGN PATENT DOCUMENTS

CN 1617445 A 5/2005
CN 107924881 A 4/2018
(Continued)

OTHER PUBLICATIONS

An Office Action issued by the German Patent and Trade Mark Office dated Jul. 19, 2022, which corresponds to German Patent Application No. 112019006965.9 and is related to U.S. Appl. No. 17/276,348; with English language translation.
(Continued)

*Primary Examiner* — Peniel M Gumedzoe
(74) *Attorney, Agent, or Firm* — Studebaker & Brackett PC (57) ABSTRACT

A device (2) is provided on an upper surface of the device substrate (1). A sealing frame (16) made of a non-electrolytic plating reactive catalyst metal is provided on the upper surface of the device substrate (1) and surrounds the device (2). An upper surface of the device substrate (1) and a lower surface of the cap substrate (10) are joined in a hollow state through the sealing frame (16). A plurality of electrodes (8, 11, 12) are connected to the device (2) and extended out of the device substrate (1) and the cap substrate (10). A metal film (20) is provided on an outer surface of the sealing frame (16) and not provided on the device substrate (1) and the cap substrate (10).

21 Claims, 10 Drawing Sheets

(58) Field of Classification Search
CPC .................. H01L 24/02; H01L 24/94; H01L 2224/03464
See application file for complete search history.

(56) References Cited

U.S. PATENT DOCUMENTS

| | | |
|---|---|---|
| 2009/0280431 A1 | 11/2009 | Hirano et al. |
| 2013/0337610 A1 | 12/2013 | Oda et al. |
| 2016/0021752 A1 | 1/2016 | Miyao et al. |
| 2016/0276244 A1 | 9/2016 | Terasaki et al. |
| 2018/0138132 A1 | 5/2018 | Nishizawa et al. |
| 2019/0090357 A1 | 3/2019 | Ito |
| 2020/0185285 A1 | 6/2020 | Nishizawa et al. |
| 2020/0365473 A1 | 11/2020 | Nishizawa |

FOREIGN PATENT DOCUMENTS

| | | |
|---|---|---|
| JP | H10-190222 A | 7/1998 |
| JP | 2009-147643 A | 7/2009 |
| JP | 2009-158962 A | 7/2009 |
| JP | 2013-064698 A | 4/2013 |
| JP | 2014-027249 A | 2/2014 |
| JP | 2016-025094 A | 2/2016 |
| TW | 2015-27032 A | 7/2015 |
| TW | 2017-19827 A | 6/2017 |
| TW | 2018-19680 A | 6/2018 |
| WO | 2017/029822 A1 | 2/2017 |
| WO | 2018/078680 A1 | 5/2018 |
| WO | 2019/176095 A1 | 9/2019 |

OTHER PUBLICATIONS

An Office Action mailed by the Korean Intellectual Property Office dated Nov. 4, 2022, which corresponds to Korean Patent Application No. 10-2021-7027024 and is related to U.S. Appl. No. 17/276,348; with English language translation.

An Office Action; "Notice of Reasons for Refusal", mailed by the Japanese Patent Office dated Apr. 5, 2022, which corresponds to Japanese Patent Application No. 2021-503339 and is related to U.S. Appl. No. 17/276,348; with English language translation.

International Search Report; Written Opinion; and Notification of Transmittal of the International Search Report and the Written Opinion of the International Searching Authority, or the Declaration issued in PCT/JP2019/008876; dated May 21, 2019.

Office Action issued in TW109106215; mailed by the Taiwanese Patent Office datedSep. 1, 2020.

An Office Action mailed by China National Intellectual Property Administration on Jan. 4, 2024, which corresponds to Chinese Patent Application No. 201980089376.5 and is related to U.S. Appl. No. 17/276,348; with English language translation.

An Office Action mailed by China National Intellectual Property Administration on May 16, 2024, which corresponds to Chinese Patent Application No. 201980089376.5 and is related to U.S. Appl. No. 17/276,348; with English language translation.

\* cited by examiner

SEMICONDUCTOR DEVICE AND METHOD FOR MANUFACTURING THE SAME

FIELD

The present invention relates to a semiconductor device in which a device substrate and a cap substrate are joined in a hollow state and a method for manufacturing the same.

BACKGROUND

A semiconductor device in which a device unit is sealed in an airtight state to prevent degradation due to environment such as humidity and maintain device characteristics so that high reliability is obtained has been used. As one of such semiconductor devices, a semiconductor device in which a sealing frame is formed around a device of a device substrate and in which the device substrate and a cap substrate are joined in a hollow state through the sealing frame has been disclosed.

In a case in which the sealing frame is formed of metal particle paste, a void space (pore) remains between particles when metal bulk formation in a joining process is insufficient. This void space is connected with a hollow part and the outside in an open pore as a leak path in some cases. To avoid this, a CVD film is formed on the surface of the sealing frame in a conventional technology (refer to Patent Literature 1, for example).

CITATION LIST

Patent Literature

[Patent Literature 1] JP 2009-158962 A

SUMMARY

Technical Problem

However, the CVD film has low adhesiveness with metal or resin as the material of the sealing frame and peels off through a thermal process or handling. Accordingly, air-tightness cannot be maintained, which has been a problem.

In another technology, air-tightness is maintained by non-electrolytic plating or electroplating film formation on the surface of the semiconductor device. In the non-electrolytic plating, first, a plating object is immersed in catalyst metal solution to apply catalyst metal onto the surface of the object. Subsequently, the plating object is immersed in non-electrolytic plating solution to form a plated film on the surface on which the catalyst metal functions. The catalyst metal is likely to be applied not only on metal but also on the surface of a semiconductor substrate. Thus, plating growth of a non-electrolytic plating film occurs on the semiconductor substrate, and deposition only on the sealing frame cannot be performed. A plurality of electrodes extended out of the device are present on the surface of the device substrate or the cap substrate. With this configuration, when plating growth of the non-electrolytic plating film occurs to the entire device surface, the electrodes are shorted and the device cannot function, which has been another problem.

The present invention is intended to solve the above-described problems and provide a semiconductor device that can prevent short electrodes while maintaining air-tightness and a method for manufacturing the same.

Solution to Problem

A semiconductor device according to the present disclosure includes: a device substrate; a device provided on an upper surface of the device substrate; a cap substrate; a sealing frame provided on the upper surface of the device substrate, surrounding the device, made of a non-electrolytic plating reactive catalyst metal, and joining the device substrate and the cap substrate in a hollow state; a plurality of electrodes connected to the device and extended out of the device substrate and the cap substrate; and a metal film provided on an outer surface of the sealing frame and not provided on the device substrate and the cap substrate.

Advantageous Effects of Invention

In the present disclosure, the sealing frame is made of a non-electrolytic plating reactive catalyst metal. Thus, the metal film can be formed on the sealing frame by non-electrolytic plating without forming the metal film on the device substrate and the cap substrate. The outer surface of the sealing frame is covered by the metal film, thereby maintaining air-tightness. In addition, the metal film is not formed on the device substrate and the cap substrate, and thus it is possible to prevent short between the plurality of electrodes extended out of the device substrate and the cap substrate.

DESCRIPTION OF EMBODIMENTS

A semiconductor device and a method for manufacturing the same according to the embodiments of the present disclosure will be described with reference to the drawings. The same components will be denoted by the same symbols, and the repeated description thereof may be omitted.

Embodiment 1

Figure 1:
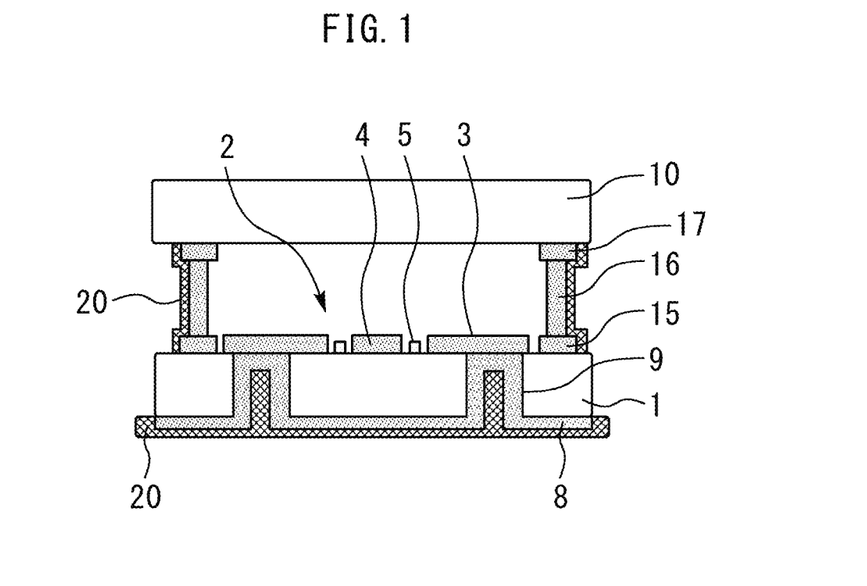
FIG. 1 is a cross-sectional view illustrating a semiconductor device according to Embodiment 1.
Figure 2:
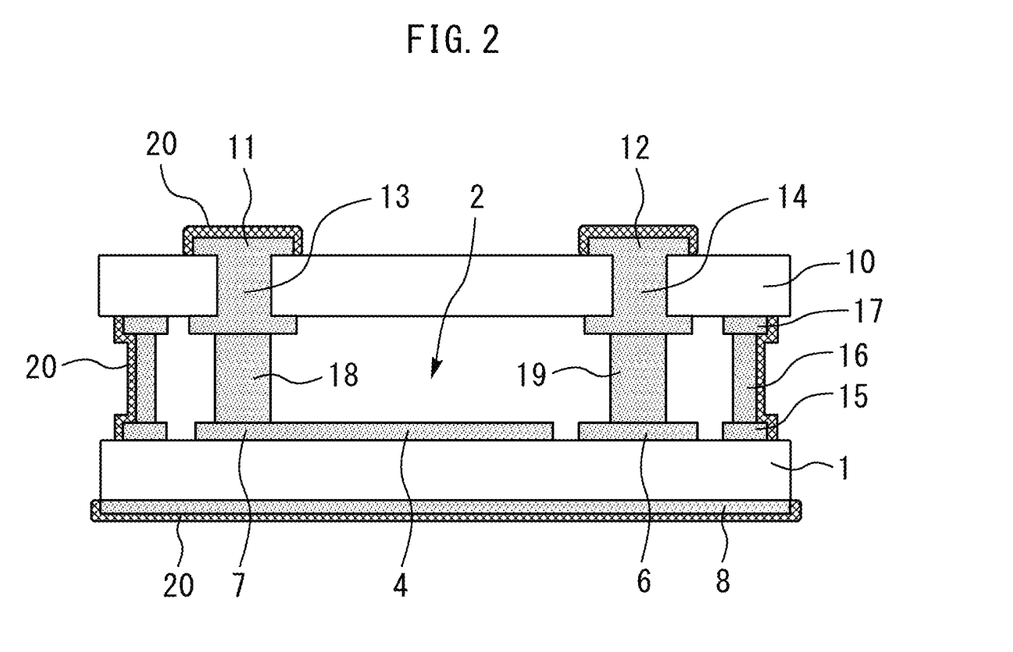
FIG. 2 is a cross-sectional view illustrating a semiconductor device according to Embodiment 1.
Figure 3:
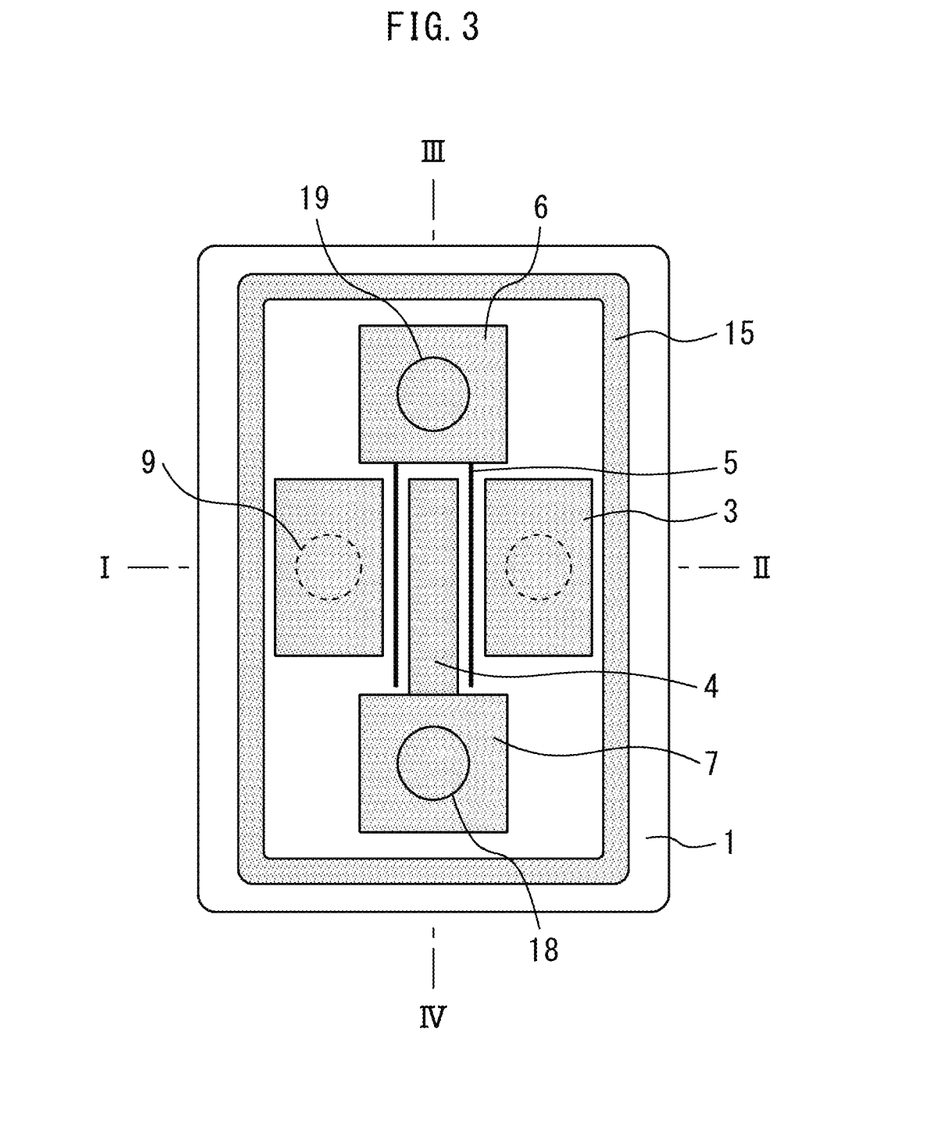
FIG. 3 is a top view illustrating a device substrate according to Embodiment 1.
Figure 4:
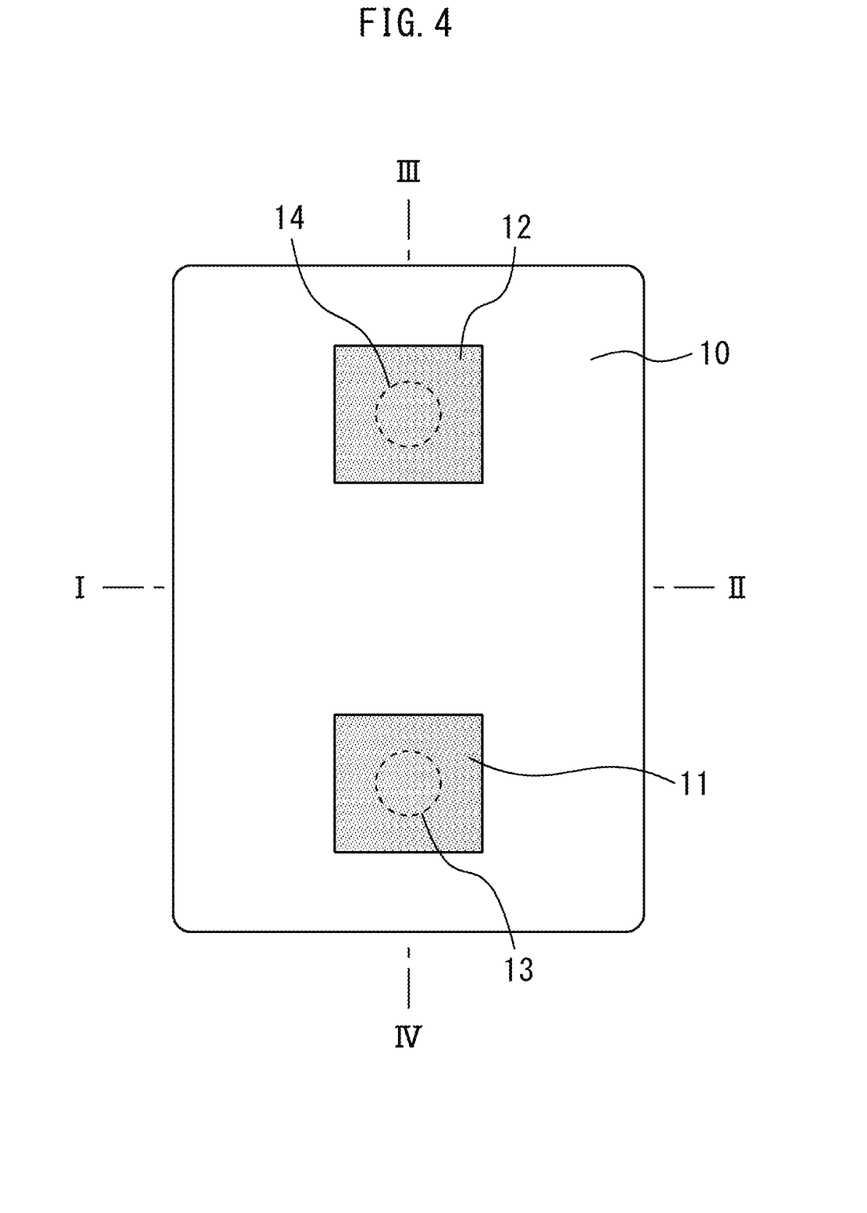
FIG. 4 is a top view illustrating a cap substrate according to Embodiment 1.

FIGS. 1 and 2 are cross-sectional views illustrating a semiconductor device according to Embodiment 1. FIG. 3 is a top view illustrating a device substrate according to Embodiment 1. FIG. 4 is a top view illustrating a cap substrate according to Embodiment 1. FIG. 1 corresponds to a cross-sectional view taken along line I-II in FIGS. 3 and 4. FIG. 2 corresponds to a cross-sectional view taken along line III-IV in FIGS. 3 and 4.

A device 2 is formed on an upper surface of a device substrate 1. The device 2 is a high electron mobility transistor (HEMT) including a source electrode 3, a drain electrode 4, and a gate electrode 5 positioned between both electrodes. However, the device is not limited to a HEMT. The device 2 outputs, as a current signal from the drain electrode 4, an output corresponding to a voltage signal input to the gate electrode 5. The source electrode 3 is a ground and supplies electrons. A gate pad 6 is connected with the gate electrode 5. A drain pad 7 is connected with the drain electrode 4. A back surface electrode 8 is formed on a lower surface of the device substrate 1. The source electrode 3 is connected with the back surface electrode 8 through a via 9 penetrating through the device substrate 1.

Extraction electrodes 11 and 12 are formed on an upper surface of a cap substrate 10. The extraction electrodes 11 and 12 are connected with vias 13 and 14, respectively, penetrating through the cap substrate 10.

A receiving pad 15 is formed on the upper surface of the device substrate 1 and surrounds the device 2. A sealing frame 16 is formed on the receiving pad 15 and surrounds the device 2 on the upper surface of the device substrate 1. A receiving pad 17 is formed on a lower surface of the cap substrate 10 and surrounds the vias 13 and 14.

The upper surface of the device substrate 1 and the lower surface of the cap substrate 10 are joined in a hollow state through the sealing frame 16. The sealing frame 16 is joined with the receiving pad 15 and the receiving pad 17. The drain pad 7 and the gate pad 6 are connected with the vias 13 and 14, respectively, through connection bumps 18 and 19.

A metal film 20 is formed on an outer surface of the sealing frame 16 but not on the device substrate 1 and the cap substrate 10. The sealing frame 16 is made of a non-electrolytic plating reactive catalyst metal. Thus, the metal film 20 can be formed on the outer surface of the sealing frame 16 by non-electrolytic plating without forming the metal film 20 on the device substrate 1 and the cap substrate 10. In addition, outermost surfaces of the receiving pads 15 and 17 and outermost surfaces of the back surface electrode 8 and the extraction electrodes 11 and 12 are made of a non-electrolytic plating reactive catalyst metal. Thus, the metal film 20 can be formed to cover joining parts of the receiving pads 15 and 17 with the sealing frame 16, and the receiving pads 15 and 17.

Subsequently, a method for manufacturing the semiconductor device according to the present embodiment will be described. FIGS. 5 to 8 are cross-sectional views illustrating the method for manufacturing the semiconductor device according to Embodiment 1.

Figure 5:
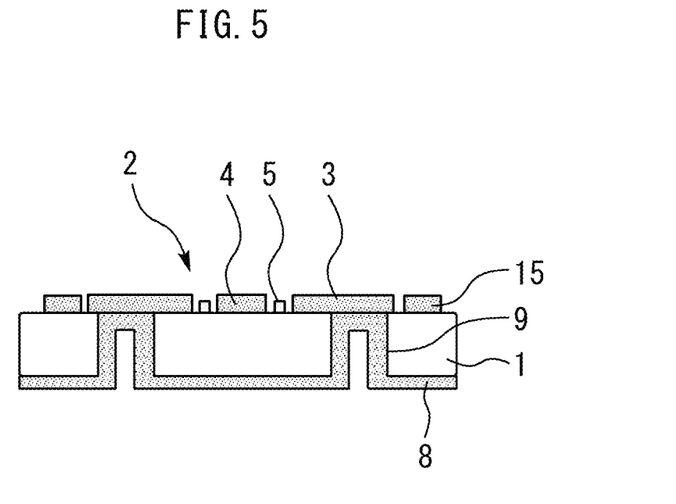
FIG. 5 is a cross-sectional view illustrating the method for manufacturing the semiconductor device according to Embodiment 1.
Figure 6:
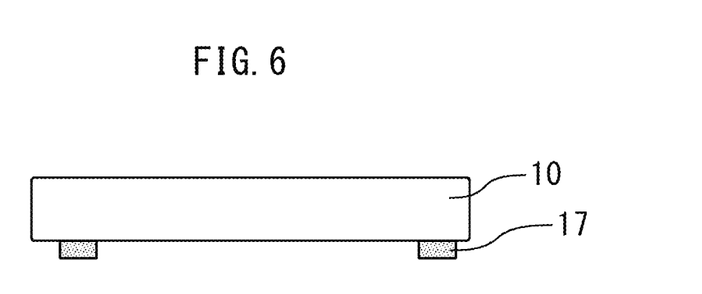
FIG. 6 is a cross-sectional view illustrating the method for manufacturing the semiconductor device according to Embodiment 1.

First, as illustrated in FIG. 5, the device 2 is formed by performing deposition, a fabrication process, and the like on the upper surface of the device substrate 1 including an epitaxial layer. The receiving pad 15 surrounding the device 2 is formed. The back surface electrode 8 is formed on the lower surface of the device substrate 1. As illustrated in FIG. 6, the receiving pad 17 is formed on the lower surface of the cap substrate 10. The extraction electrodes 11 and 12 are formed on the upper surface of the cap substrate 10.

The back surface electrode 8, the extraction electrodes 11 and 12, and the receiving pads 15 and 17 are formed of a catalyst metal by a spattering or evaporation coating method. When continuous deposition by evaporation coating or spattering is performed on the receiving pads 15 and 17, only the outermost surfaces of which are made of a catalyst metal, the catalyst metal is not easily formed on side surfaces in patterning, and thus a sophisticated formation method is needed.

Figure 7:
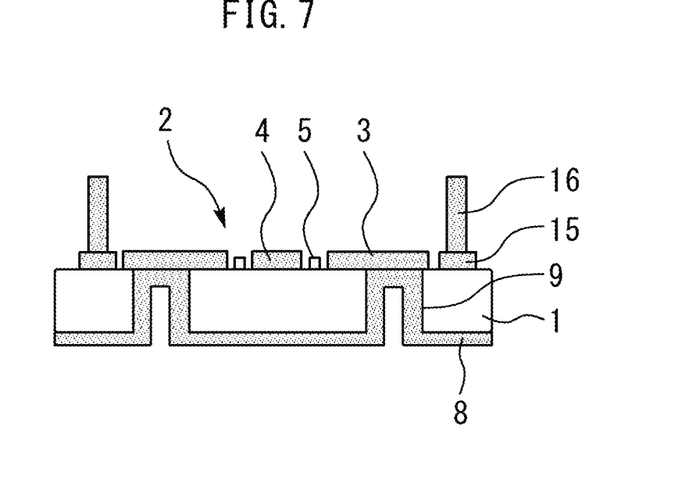
FIG. 7 is a cross-sectional view illustrating the method for manufacturing the semiconductor device according to Embodiment 1.

Subsequently, as illustrated in FIG. 7, the sealing frame 16 is formed on the receiving pad 15 in alignment. For example, the sealing frame 16 is formed by a screen printing method or the like using metal particle paste of a non-electrolytic plating reactive catalyst metal. Examples of the metal particle paste include Au, Ag, Cu, Pt, and Pd. The material of the sealing frame 16 is preferably same as that of the receiving pads 15 and 17 for increased adhesiveness.

Figure 8:
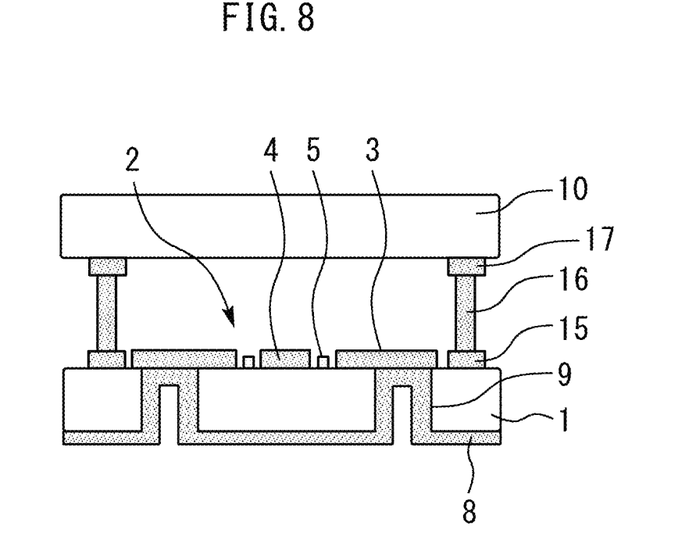
FIG. 8 is a cross-sectional view illustrating the method for manufacturing the semiconductor device according to Embodiment 1.

Subsequently, as illustrated in FIG. 8, the device substrate 1 and the cap substrate 10 are aligned, and the upper surface of the device substrate 1 and the lower surface of the cap substrate 10 are joined in a hollow state through the sealing frame 16. Accordingly, a HEMT device having a hollow structure is obtained. Metal particles of the sealing frame 16 are formed into a bulk through heating and pressurization at joining. Thereafter, non-electrolytic plating is performed to form the metal film 20 on each of the outer surface of the sealing frame 16, the receiving pads 15 and 17, the extraction electrodes 11 and 12, and the back surface electrode 8 as illustrated in FIGS. 1 and 2.

When non-electrolytic plating is performed, a plating metal ion metalizing reaction occurs in the vicinity of a plating surface, and a plated film is formed. This reaction typically does not proceed due to reaction barrier. It is known that the reaction proceeds when the reaction barrier is reduced by a catalyst metal. Thus, plating can be performed only on the surface of the catalyst metal or a surface on which the catalyst metal is applied through preprocessing. When the catalyst metal surface is covered by a plated film, the thickness of the plated film increases through an autocatalytic reaction in which plating reaction proceeds with the covering plated film as a catalyst.

A catalyst application process needs to be performed in normal non-electrolytic plating, but in the present embodiment, the catalyst application process is unnecessary since a plating surface is made of a catalyst metal. Thus, the HEMT device is directly immersed in non-electrolytic plating solution without immersion in catalyst metal solution as preprocessing. Accordingly, the metal film 20 can be selectively formed only on the sealing frame 16 and the like, which are made of a catalyst metal, without forming the metal film 20 on the device substrate 1 and the cap substrate 10 on which a catalyst metal is not applied.

Figure 9:
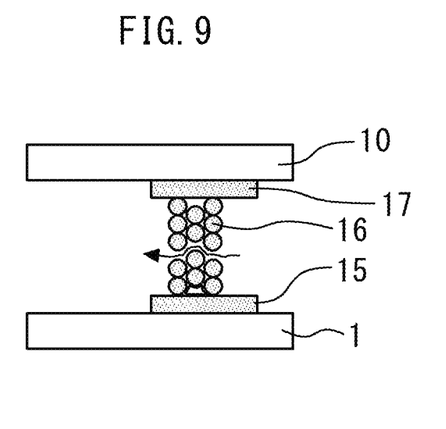
FIG. 9 is a cross-sectional view illustrating the joining parts of a semiconductor device according to Comparative Example 1.

Subsequently, effects of the present embodiment will be described below in comparison with comparative examples. FIG. 9 is a cross-sectional view illustrating the joining parts of a semiconductor device according to Comparative Example 1. In a case in which the sealing frame 16 is formed of metal particle paste, a void space (pore) remains between particles when metal bulk formation in a joining process is insufficient. This void space is connected with a hollow part and the outside in an open pore as a leak path, which degrades air-tightness of the hollow structure. However, in the present embodiment, the outer surface of the sealing frame 16 is covered by the metal film 20 of high coverage and high adhesiveness. Accordingly, the leak path in the sealing frame 16 can be blocked to maintain air-tightness of the hollow structure.

In addition, in the present embodiment, the metal film 20 is not formed on the device substrate 1 and the cap substrate 10. Thus, it is possible to prevent short between the back surface electrode 8 and each of the extraction electrodes 11 and 12, which are connected with the device 2 and extended out of the device substrate 1 and the cap substrate 10.

Figure 10:
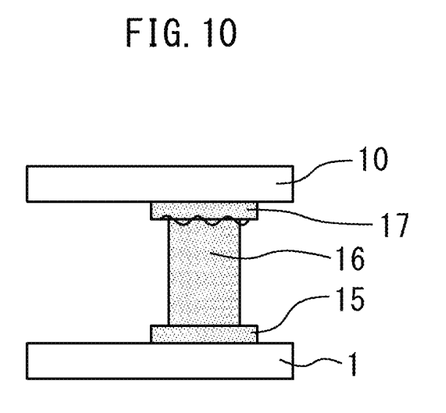
FIG. 10 is a cross-sectional view illustrating the joining parts of a semiconductor device according to Comparative Example 2.

FIG. 10 is a cross-sectional view illustrating the joining parts of a semiconductor device according to Comparative Example 2. When a foreign object is sandwiched at the joining part of the sealing frame 16 and the receiving pads 15 and 17, a leak path to a hollow part is generated due to surface oxidation, surface flatness defect, and the like of the receiving pads 15 and 17. However, in the present embodiment, the metal film 20 covers the joining part of the sealing frame 16 and the receiving pads 15 and 17, thereby maintaining air-tightness.

In the present embodiment, the metal film 20 is formed on the surfaces of all electrodes extended out of the device substrate 1 and the cap substrate 10 by non-electrolytic plating, but the metal film 20 may be formed only on any necessary electrode but not on the other electrodes. For example, when a back surface of the device is soldered by SnAg and an Al wire is connected on a cap side, the extraction electrodes 11 and 12 on the cap substrate 10 side are made of Al, and the outermost surface of the back surface electrode 8 on the device substrate 1 side is made of Pd. In this case, the metal film 20 is formed on the surfaces of the sealing frame 16 and the back surface electrode 8 by non-electrolytic plating, but not on the extraction electrodes 11 and 12. The back surface electrode 8 may have barrier property against solder due to the metal film 20, and the extraction electrodes 11 and 12 may be Al electrodes that are excellently joined with the Al wire.

A catalyst metal is, for example, Au, Ag, Cu, Ni, Co, Pd, Pt, In, Sn, or Rh. The catalyst metal is preferably a noble metal such as Au, Ag, Pd, Pt, or Rh since adhesiveness with a non-electrolytic plating film degrades through surface oxidation. In particular, Au, Pt, and Pd are unlikely to be oxidized and formed into a bulk at relatively low temperature and low pressure, and thus are suitable as the material of the sealing frame 16. The catalyst metal is more preferably Pt or Pd, which have a high catalyst property in non-electrolytic plating. Accordingly, a non-electrolytic plating film formation reaction is stabilized. These catalyst metals do not have high adhesiveness with the device substrate 1 in some cases. Thus, for adhesiveness improvement, a thin adhesion layer may be deposited and the catalyst metals may be deposited thereon. For example, Ti is deposited at a thickness of 50 nm approximately on a Si substrate or a GaAs substrate, and then Au is deposited at a thickness of 1 μm.

The metal film 20 is, for example, a nickel-phosphorus (Ni—P) alloy plate. The metal film 20 is not limited thereto but may be made of any of Au, Ag, Cu, Ni, Co, Pd, Pt, In, Sn, and Rh, or an alloy thereof, with which non-electrolytic plating is possible. The metal film 20 is preferably made of any of Ni, Co, Pd, and Rh, or an alloy thereof, which have barrier property against solder. However, a Ni alloy, a Co alloy, and a Rh alloy have poor soldering wettability, and thus an Au layer is formed on an outermost surface by continuously performing exchangeable non-electrolytic Au plating. Accordingly, a surface having excellent soldering wettability can be obtained. In this case, the Au layer has a thickness of 30 to 50 nm approximately.

Figure 11:
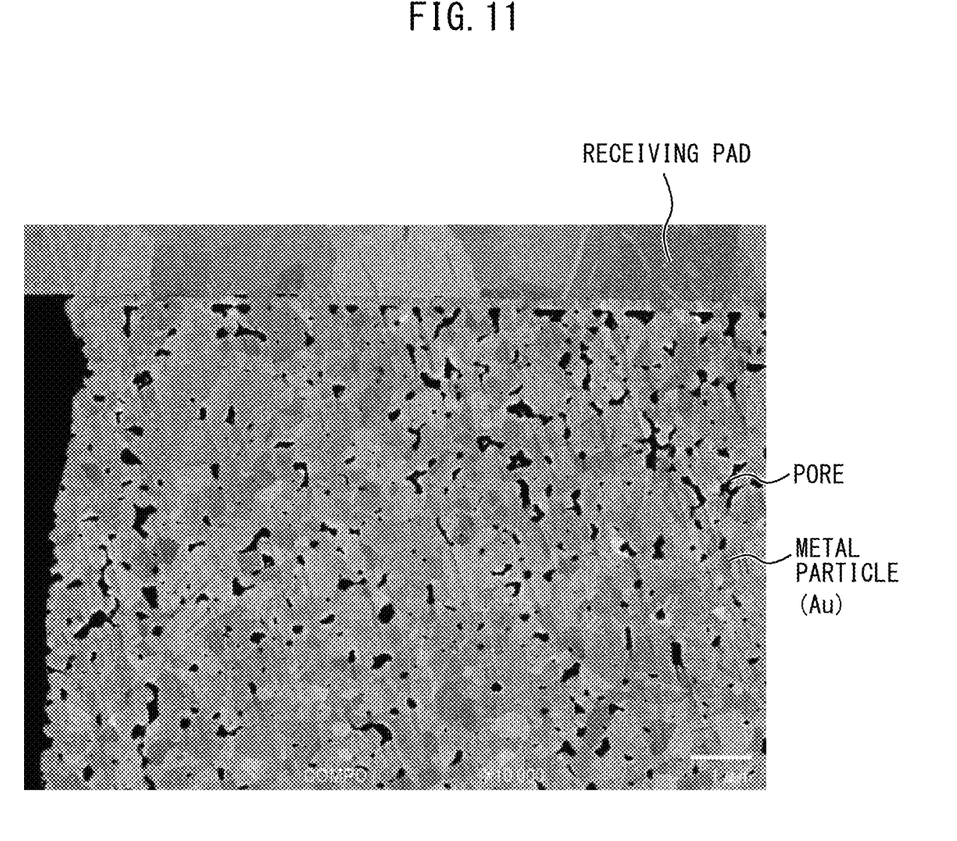
FIG. 11 is an enlarged cross-sectional view illustrating a sealing frame part formed by using Au submicron particle paste.

FIG. 11 is an enlarged cross-sectional view illustrating a sealing frame part formed by using Au submicron particle paste. It can be observed that pores are scattered in the submicron order. Since only one section is illustrated, it appears that the pores are separated. However, in reality, open pores are connected as a leak path.

When such submicron particle paste is used as the metal particle paste used for the sealing frame 16, the diameter of each open pore, which causes a joining defect, is of the submicron order. Thus, it is possible to completely block open pores by forming the metal film 20 at a thickness of 1 μm or larger. The diameter of each open pore further decreases when nanoparticle paste is used, and thus the thickness of 1 μm or larger suffices for the metal film 20. In addition, pinholes are likely to be generated in a non-electrolytic plating film at the initial stage of plating growth, and thus, the metal film 20 is preferably formed to the thickness of 1 μm or larger, at which pinholes are not generated. Moreover, a non-electrolytic plating film has high internal stress, and thus flake or crack due to the stress is likely to occur at the thickness of 10 μm or larger. For this reason, the thickness of the metal film 20 needs to be smaller than 10 μm.

Figure 12:
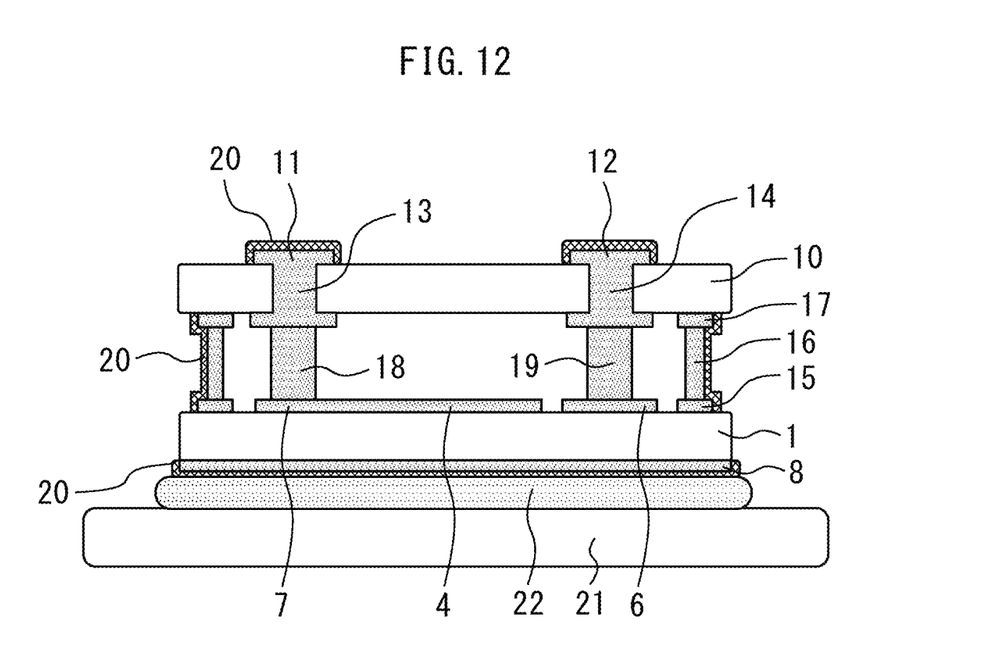
FIG. 12 is a cross-sectional view illustrating a state in which a mounting substrate is mounted on a lower surface of the semiconductor device according to Embodiment 1.
Figure 13:
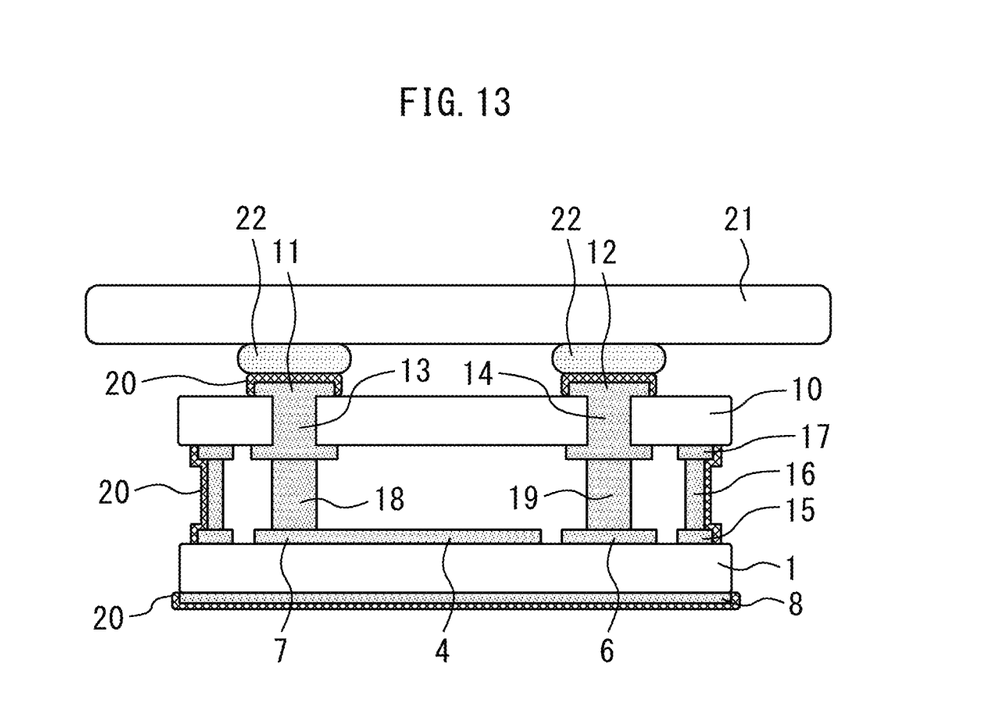
FIG. 13 is a cross-sectional view illustrating a state in which the mounting substrate is mounted on an upper surface of the semiconductor device according to Embodiment 1.

FIG. 12 is a cross-sectional view illustrating a state in which a mounting substrate is mounted on a lower surface of the semiconductor device according to Embodiment 1. The back surface electrode 8 of the device substrate 1 is joined with an electrode (not illustrated) of this mounting substrate 21 by a solder 22. FIG. 13 is a cross-sectional view illustrating a state in which the mounting substrate is mounted on an upper surface of the semiconductor device according to Embodiment 1. The extraction electrodes 11 and 12 of the cap substrate 10 are joined with electrodes (not illustrated) of the mounting substrate 21 by the solder 22. The metal film 20 covering the back surface electrode 8 and the extraction electrodes 11 and 12 functions as a barrier layer against the solder 22, and thus, for example, characteristic degradation due to diffuse of the solder 22 on the device side can be prevented. For example, the metal film 20 made of a Ni alloy needs the thickness of 3 μm or larger to obtain the barrier property against solder. However, the thickness of 10 μm or larger for the metal film 20 can cause flake or crack, and thus the thickness is preferably smaller than 10 μm.

Embodiment 2

Figure 14:
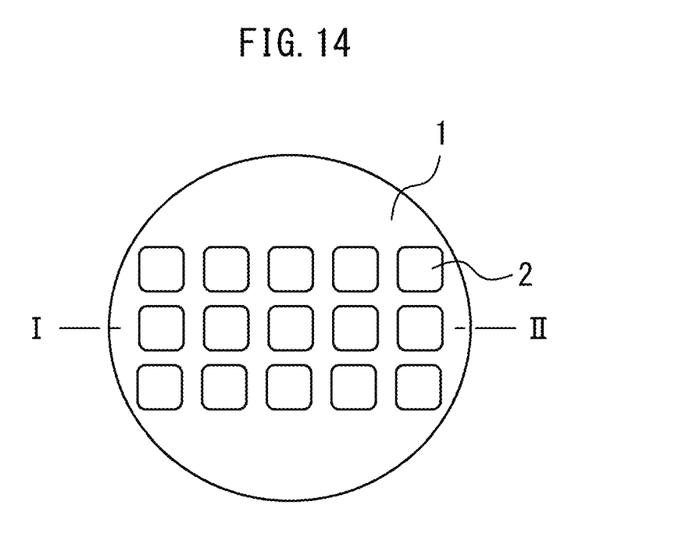
FIG. 14 is a plan view illustrating a semiconductor device manufacturing method according to Embodiment 2.

FIG. 14 is a plan view illustrating a semiconductor device manufacturing method according to Embodiment 2. FIGS. 15 to 18 are cross-sectional views illustrating the semiconductor device manufacturing method according to Embodiment 2. FIGS. 15 to 18 correspond to cross-sectional views taken along line I-II in FIG. 14. Specific configurations of the device 2, the back surface electrode 8, the extraction electrodes 11 and 12, and the like are not illustrated.

Figure 15:
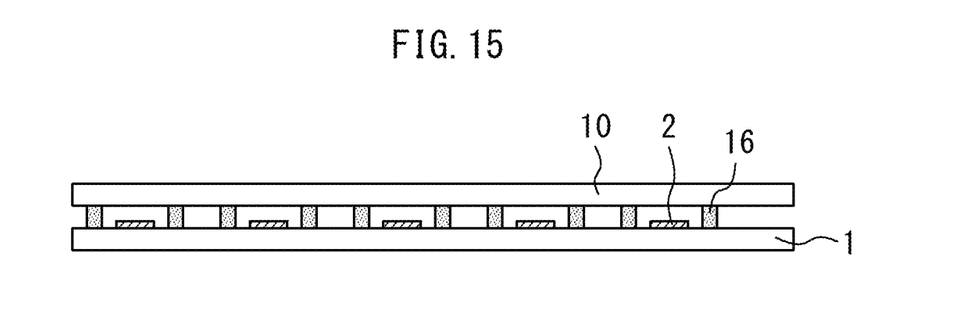
FIG. 15 is a cross-sectional view illustrating the semiconductor device manufacturing method according to Embodiment 2.
Figure 16:
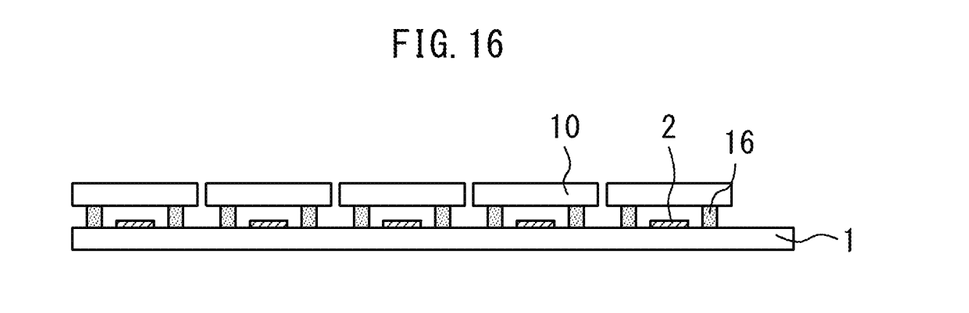
FIG. 16 is a cross-sectional view illustrating the semiconductor device manufacturing method according to Embodiment 2.
Figure 17:
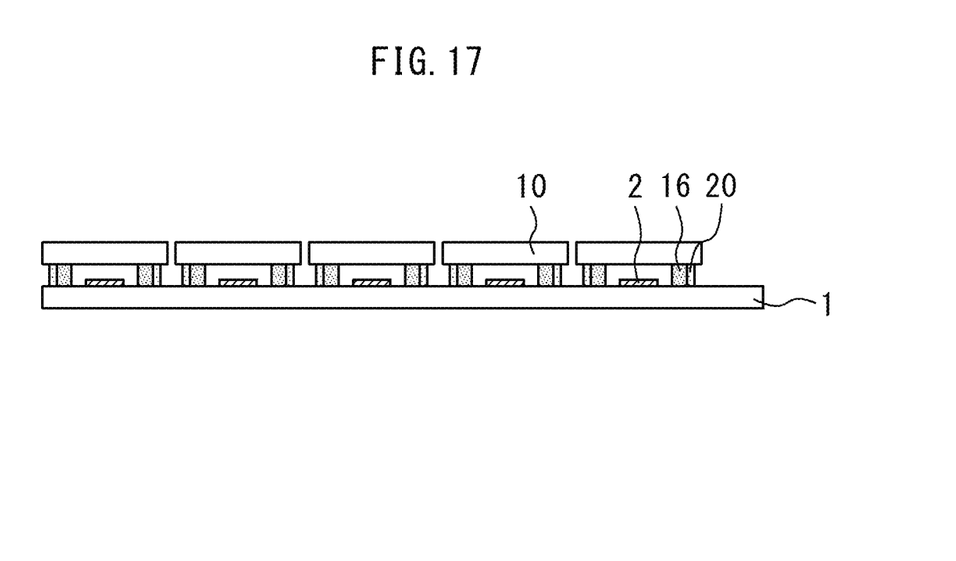
FIG. 17 is a cross-sectional view illustrating the semiconductor device manufacturing method according to Embodiment 2.
Figure 18:
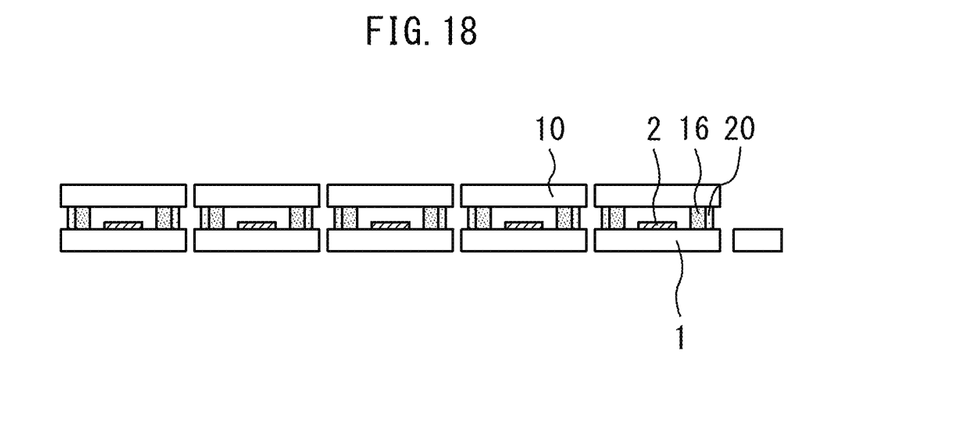
FIG. 18 is a cross-sectional view illustrating the semiconductor device manufacturing method according to Embodiment 2.

As illustrated in FIG. 14, a plurality of devices 2 having the same pattern are formed on the upper surface of the device substrate 1 of a disk shape. Subsequently, as illustrated in FIG. 15, the device substrate 1 and the cap substrate 10 are joined in a hollow state through the sealing frame 16. Subsequently, as illustrated in FIG. 16, only the cap substrate 10 is diced through half cut and separated into the individual devices 2. Subsequently, as illustrated in FIG. 17, the metal film 20 is formed on the outer surface of the sealing frame 16 by non-electrolytic plating. Subsequently, as illustrated in FIG. 18, the device substrate 1 is diced and separated into the individual devices 2.

Since the device substrate 1 is not diced and the plurality of devices 2 are connected at the stage of the non-electrolytic plating, the non-electrolytic plating can be performed for each wafer. In addition, plating solution flow is incident on each device 2 in a stabilized manner. Moreover, the non-electrolytic plating can be efficiently performed, and accordingly, characteristics of the metal film 20 are stabilized. The metal film 20 may be formed after only the device substrate 1 is diced, and then the device substrate 1 may be further diced.

REFERENCE SIGNS LIST 1 device substrate; 2 device; 8 back surface electrode; 10 cap substrate; 11, 12 extraction electrode; 15, 17 receiving pad; 16 sealing frame; 20 metal film

The invention claimed is:

1. A semiconductor device comprising:
    a device substrate;
    a device provided on an upper surface of the device substrate;
    a cap substrate;
    a sealing frame provided on the upper surface of the device substrate, surrounding the device, made of a non-electrolytic plating reactive catalyst metal, and joining the device substrate and the cap substrate in a hollow state;
    a plurality of electrodes connected to the device and extended out of the device substrate and the cap substrate; and
    a metal film bonded to an outer surface of the sealing frame and not bonded to the device substrate and the cap substrate.

2. The semiconductor device according to claim 1, further comprising:
    a first receiving pad provided on the upper surface of the device substrate and surrounding the device; and
    a second receiving pad provided on a lower surface of the cap substrate, wherein
    the sealing frame is joined with the first receiving pad and the second receiving pad,
    outermost surfaces of the first and second receiving pads are made of a non-electrolytic plating reactive catalyst metal, and
    the metal film covers joining parts of the first and second receiving pads with the sealing frame.

3. The semiconductor device according to claim 1, wherein
    outermost surfaces of the plurality of electrodes are made of a non-electrolytic plating reactive catalyst metal, and the metal film covers surfaces of the plurality of electrodes extended out of the device substrate and the cap substrate which are joined.

4. The semiconductor device according to claim 1, wherein the catalyst metal is Au, Ag, Cu, Ni, Co, Pd, Pt, In, Sn, or Rh.

5. The semiconductor device according to claim 1, wherein the catalyst metal is Au, Ag, Pd, Pt, or Rh.

6. The semiconductor device according to claim 1, wherein the catalyst metal is Pt or Pd.

7. The semiconductor device according to claim 1, wherein the metal film is made of any of Au, Ag, Cu, Ni, Co, Pd, Pt, In, Sn, and Rh, or an alloy thereof.

8. The semiconductor device according to claim 1, wherein the metal film is made of any of Ni, Co, Pd, and Rh, or an alloy thereof.

9. The semiconductor device according to claim 1, wherein a thickness of the metal film is 1 μm or larger and smaller than 10 μm.

10. The semiconductor device according to claim 1, wherein
    the metal film is bonded only to an outer surface of the sealing frame.

11. A method for manufacturing a semiconductor device comprising:
    forming a device on an upper surface of a device substrate;
    forming a sealing frame surrounding the device on the upper surface of the device substrate by using metal particle paste of a non-electrolytic plating reactive catalyst metal;
    aligning the device substrate and a cap substrate and joining the device substrate and the cap substrate in a hollow state through the sealing frame;
    forming a plurality of electrodes connected to the device and extended out of the device substrate and the cap substrate; and
    after joining the device substrate and the cap substrate, bonding a metal film on an outer surface of the sealing frame by non-electrolytic plating without bonding the metal film on the device substrate and the cap substrate.

12. The method for manufacturing a semiconductor device according to claim 11, further comprising:
    forming a first receiving pad surrounding the device on the upper surface of the device substrate; and
    forming a second receiving pad on a lower surface of the cap substrate, wherein
    the sealing frame is joined with the first receiving pad and the second receiving pad,
    outermost surfaces of the first and second receiving pads are made of a non-electrolytic plating reactive catalyst metal, and
    the metal film covers joining parts of the first and second receiving pads with the sealing frame.

13. The method for manufacturing a semiconductor device according to claim 11, wherein
    outermost surfaces of the plurality of electrodes are made of a non-electrolytic plating reactive catalyst metal, and
    the metal film covers surfaces of the plurality of electrodes extended out of the device substrate and the cap substrate which are joined.

14. The method for manufacturing a semiconductor device according to claim 11, wherein
    the devices are formed on the upper surface of the device substrate, after only one of the device substrate and the cap substrate is diced and separated into the individual devices, the metal film is formed, and after the metal film is formed, the other of the device substrate and the cap substrate is diced and separated into the individual devices.

15. The method for manufacturing a semiconductor device according to claim 11, wherein the catalyst metal is Au, Ag, Cu, Ni, Co, Pd, Pt, In, Sn, or Rh.

16. The method for manufacturing a semiconductor device according to claim 11, wherein the catalyst metal is Au, Ag, Pd, Pt, or Rh.

17. The method for manufacturing a semiconductor device according to claim 11, wherein the catalyst metal is Pt or Pd.

18. The method for manufacturing a semiconductor device according to claim 11, wherein the metal film is made of any of Au, Ag, Cu, Ni, Co, Pd, Pt, In, Sn, and Rh, or an alloy thereof.

19. The method for manufacturing a semiconductor device according to claim 11, wherein the metal film is made of any of Ni, Co, Pd, and Rh, or an alloy thereof.

20. The method for manufacturing a semiconductor device according to claim 11, wherein a thickness of the metal film is 1 μm or larger and smaller than 10 μm.

21. The method of manufacturing a semiconductor device according to claim 11, wherein
non-electrolytic plating the metal film on an outer surface of the sealing frame is performed only on an outer surface of the sealing frame.

\* \* \* \* \*